United States Patent [19]

Heiblum et al.

[11] Patent Number: 4,833,517

[45] Date of Patent: May 23, 1989

[54] THETA DEVICE WITH IMPROVED BASE CONTACT

[75] Inventors: Mordehai Heiblum, Yorktown Heights; Christina M. Knoedler, Peekskill; David C. Thomas, Ithaca, all of N.Y.

[73] Assignee: International Business Machines Corporation, Armonk, N.Y.

[21] Appl. No.: 43,066

[22] Filed: Apr. 27, 1987

[51] Int. Cl.[4] .............................................. H01L 29/72
[52] U.S. Cl. ...................................... 357/34; 357/16; 357/12; 357/4
[58] Field of Search ...................... 357/16, 65, 34, 86, 357/4, 12

[56] References Cited

U.S. PATENT DOCUMENTS 4,586,071  4/1986  Tiwari ................................... 357/16
4,691,215  9/1987  Luryi ..................................... 357/16

FOREIGN PATENT DOCUMENTS 61-19167  1/1986  Japan .

OTHER PUBLICATIONS

IBM Technical Disclosure Bulletin, vol. 19 #5 pp. 2235-2236 Oct. 1986.

Primary Examiner—William L. Sikes
Assistant Examiner—Mark Prenty
Attorney, Agent, or Firm—Scully, Scott, Murphy & Presser

[57] ABSTRACT

A vertical ballistic transistor is described. Base metallic contacts of reliable thickness are deposited on a carrier depletable layer and diffuse into the base. A depletion region forms in the depletable layer. The depletion region electrically isolates the base contact from the emitter. The thickness of the depletable layer prevents the generation of usual depletion regions in the base that tend to cut off base current.

6 Claims, 1 Drawing Sheet

THETA DEVICE WITH IMPROVED BASE CONTACT

BACKGROUND OF THE INVENTION

Since the invention of the transistor, manufacturers, researchers and users have constantly sought to improve the device by reducing its size and increasing its speed of operation. In a vertical transistor charge carriers pass from one vertical layer to an adjacent layer. The speed of such a vertical device depends upon the time that it takes for a charge carrier, such as an electron, to pass from one layer of the device to an adjacent layer.

Some semi-conductor compounds, especially those comprising group III-V elements, and in particular, compounds of gallium arsenide are capable of transferring charge carriers, such as electrons, with minimum scattering of electrons. Such type of transport of charges is commonly called "ballistic." See, Trudy E. Bell, "The Quest For Ballistic Action," IEEE Spectrum, February 1986, p. 36.

Transistors in general are broadly classified into vertical or horizontal structures. In a horizontal structure charge carriers are generated at a source and pass laterally through a channel toward a drain horizontally displaced from the source. Above the channel is a gate. A voltage on the gate controls the horizontal passage of charge carriers from the source to the drain.

A vertical transistor fabricated from gallium arsenide and aluminum gallium arsenide that exhibits ballistic electron transfer was originally proposed by one of the inventors of this invention. See, Mordehai Heiblum, "Tunneling Hot Electron Transfer Amplifiers," 24 Solid State Electronics, page 343 (1981). Since that proposal, a vertical type tunneling hot electron transfer amplifier (THETA) has been constructed and ballistic transport of electrons in such a device has been directly observed. See, Heiblum, et al. "Tunneling Hot Electron Transfer Amplifier: A Hot-Electron GA As Device With Current Gain", Applied Physics Letters, 47 November, 1985, pages 1105–1107; Heiblum, et al., "Direct Observation of Ballistic Transport in Ga As", Physical Review of Letters, 55 No. 20, November, 1985, pages 2200–2203.

The practical fabrication of THETA devices is difficult. The base electrode is a layer of very thin material, disposed beneath the emitter. Ohmic contacts, when applied to the base, diffuse into the base. The base material is normally constructed from a heavily doped gallium arsenide layer. The base regions exposed to air will have a depletion layer. Since the base is so thin, the depletion layer will greatly increase the base resistance. This will increase coupling between output and input circuits of the device and impede its frequency performance. Ohmic contacts to GaAs are usually formed by diffusing a metal into the GaAs, thus resulting in a substantial penetration depth into the base. This may result in shorting the base to the collector thereby rendering the device inoperable. Attempts have been made to overcome such problems by using relatively shallow contact techniques. Such shallow contacts do not consistently yield the desired conductor performance required and they are difficult to fabricate.

SUMMARY OF THE INVENTION

The invention provides a vertically operable multilayer ballistic or THETA transistor. In the course of fabricating this transistor a layer of conductive emitter material remains above the base electrode. The layer is thin enough so that it is depleted of electrical carriers and thereby does not cause shorting of the base to the emitter structure. The base ohmic contacts are deposited on this emitter layer. Providing such an emitter layer effectively raises the depletion region normally associated with the surface regions exposed to air. This extra layer is thick enough to permit thicker ohmic contacts into the base. This extra layer will yield reliable electrical connections to the base layer.

Such a solution is unusual because the emitter is normally conductive. As such, one would expect that the base ohmic contacts deposited in the emitter layer would short circuit the emitter and the base since there appears to be a direct current path between the base ohmic contact and the emitter through the emitter material. However, in this invention, the depletion phenomena works as an advantage to the device. The depletion region is established in the emitter layer between the base ohmic contact and the emitter contact. That region is exposed to ambient, i.e. air and becomes depleted of charge carriers, i.e. electrons. As such, the depletion phenomena effectively insulates the base ohmic contact from the emitter despite an apparent conductive path through the emitter layer.

The THETA device of the invention is generally fabricated by depositing successive layers of doped, gallium arsenide and aluminum gallium arsenide. Those skilled in the art will recognize that other III-V elements are also useful. Fabrication is accomplished by epitaxial deposition of the layers using a molecular beam epitaxial system. A portion of the emitter material is removed by suitable means such as reactive ion etching. If desired, a "stop layer" of aluminum arsenide can be deposited on top of the emitter layer at a depth indicative of the thickness of a depletable layer. The emitter layer is etched to form an emitter electrode. Etching is terminated when the stop layer is exposed. The depth of the depletable emitter layer can also be determined by optical interferometer measurements done while etching.

A base metal contact of sufficient thickness is deposited on the thin excess depletable emitter layer situated above the base. The base contact alloys into this depletable emitter layer and penetrates into a portion of the base layer. Carrier depletion due to the interface between ambient air (or metal) and gallium arsenide is a well-known phenomena which depends upon the doping in the gallium arsenide layer. The base contact is spaced from the emitter electrode. The spacing is sufficient to provide a region between the base contact and the emitter electrode that becomes depleted of charge carriers. The emitter layer effectively raises the relative depth of the vertical boundary of the depletion region. As such, the depletion in the base electrode does not extend far enough into the base electrode to pinch off the base current.

The invention thus allows a manufacturer to use base contacts of sufficient thickness to yield reliable electrical connections with the base electrode.

As such, it is an object of the invention to provide a more easily manufactured vertical ballistic transistor. It is a further object of the invention to provide such a transistor having base ohmic contacts mounted upon a thin layer above the base layer out of which an emitter electrode is formed.

DETAILED DESCRIPTION OF THE PREFERRED EMBODIMENTS

Figure 1:
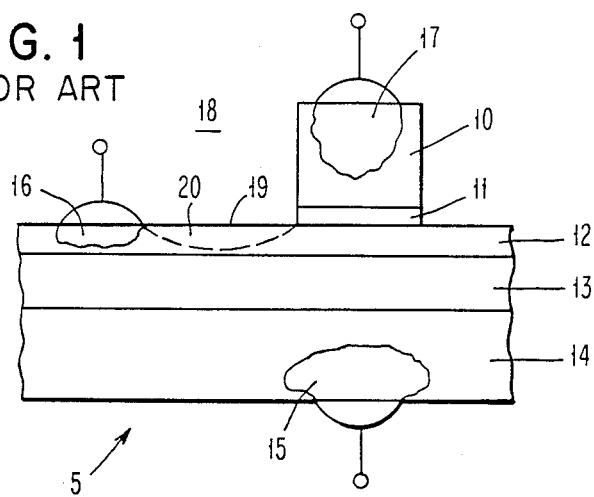
FIG. 1 is a cross-sectional view of a prior art ballistic transistor.

A vertical, ballistic transistor 5 of the prior art is shown in FIG. 1. An emitter electrode 10 of n+ doped gallium arsenide (Ga As) is disposed above an emitter tunnel barrier 11 comprising undoped aluminum gallium arsenide (Al Ga As). The emitter electrode 10 is typically 2,000 angstroms thick and the emitter tunnel barrier 11 is 100 angstroms. Beneath the tunnel barrier 11 is a base electrode 12 of n+ doped gallium arsenide. Such a base is nominally 1,000 angstroms thick or less. Beneath the base is a collector tunnel barrier 13 of undoped aluminum gallium arsenide, also approximately 1,000 angstroms thick. The lowest layer of the device is the collector 14 made of gallium arsenide, n+ doped of any suitable thickness such as 10,000 angstroms disposed on an n+ (100)-oriented GaAs substrate.

A metallic alloy emitter contact 17 is deposited on emitter electrode 10 and is diffused therein as is well-known. Relatively shallow metallic alloy base contact 16 is deposited on the base 12. Collector contact 15 is associated and deposited on the collector 14.

The aluminum gallium arsenide that forms a tunnel barrier 11 between the emitter 10 and the base 12 is relatively thin, only about 10 percent the depth of the emitter or the base 10, 12. However, the aluminum gallium arsenide alloy has an electron band gap that is significantly higher than either of the gallium arsenide layers on either side of it. That is, the amount of energy required to raise the valence electron into a conduction band is significantly higher in the emitter tunnel barrier layer 11 than it is in either the emitter 10 or the base 12. In effect, the emitter tunnel barrier 11 acts as a so-called launcher for electrons.

In transistor 5 the carrier charges are electrons. As a suitable voltage is applied to the emitter 10 via the emitter contact 15, the potential of the electrons in the emitter 10 is raised. When the electrical potential of the electrons exceeds the conduction level in the barrier layer 11, electrons begin to tunnel through the barrier layer 11 and pass to the base 12. The electrons arriving at the base 12 have a substantially higher potential energy than the valence electrons in base 12. As such, the electrons from the tunnel barrier travel in a so-called ballistic fashion. In other words, the electrons pass through the base with little or no interference from the atoms comprising the base 12.

In operation, ballistic electrons of sufficient energy from the emitter 10 transit the intermediate layers 11-13 and arrive at the collector 14. It is neither desirable nor necessary that all electrons complete that transit. The ability to control the emitter collector current is important for transistor action. The base 12 provides such control.

Electrons that leave the emitter 10 but fail to reach the collector 14 accumulate in the base 12. Unless those electrons are removed, the potential barrier between the emitter 10 and collector 14 will increase and ballistic action will terminate. Hence, it is desirable for the base 12 to have a relatively low resistance. As such, a voltage applied to the base 12 is used to raise, lower, or otherwise vary the potential barrier seen by electrons that leave the emitter 10.

The prior art device 5 of FIG. 1, has two problems: high base resistance and improper ohmic contact. The base resistance is very high due to a depletion region 20 extending between the base ohmic contact 16 and the emitter 10. Such depletion regions are natural phenomena that occur at the interface between adjacent layers of different materials. In the case of the device in FIG. 1, the interface between the ambient air 18 and the surface 19 of base 12 exposed to the air 18 depletes charge carriers from the region 20 under the exposed surface of base 12. Such depletion increases the base resistance. Increased base resistance has an adverse effect on ballistic transit as discussed above.

It is difficult to properly deposit a shallow base ohmic contact 16 on base 12 because the base 12 is 1000 angstroms thick or less. If the contact 16 is too deep, it may short the base 12 to the collector 14. Increasing the thickness of the base 12 will not help either problem. Instead, the resistance of the base will increase and the number of ballistic electrons transisting the base 12 will decrease.

Figure 2:
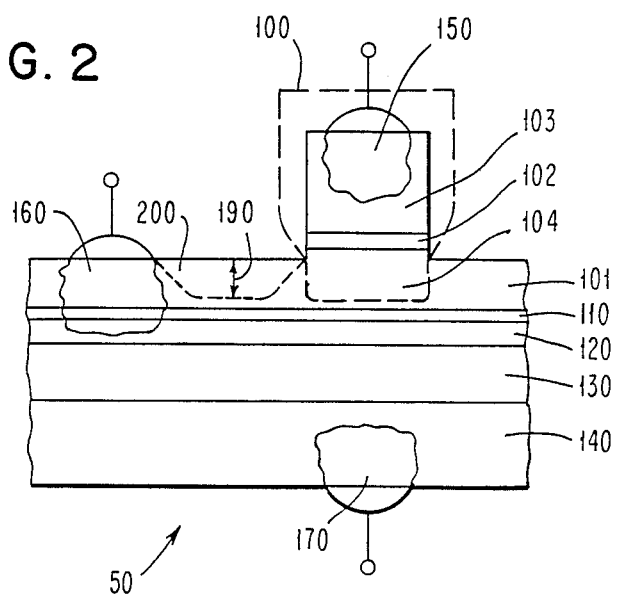
FIG. 2 is a cross-sectional view of an inventive transistor.

The inventive transistor 50 shown in FIG. 2 overcomes the problems associated with the prior art transistors 5 of FIG. 1. A vertical transistor is shown having an emitter 100 indicated in dashed outline. The emitter 100 includes an ohmic contact 150 alloyed into an upper emitter layer 103 that is deposited on a stop layer 102. The stop layer 102 indicates the upper surface of carrier depletable emitter layer 101. A portion 104 of layer 101 within the dashed lines 100 complete the emitter 100. The layer of depletable emitter material 101 lies beneath the upper emitter layer 103. An emitter tunnel barrier 110 separates the emitter 100 and emitter layer 101 from a base electrode 120. Beneath the base 120 is a collector tunnel barrier 130 that is disposed above collector 140. A metallic base contact 160 is deposited on carrier depletable layer 101 and spaced from emitter electrode 100. Collector metallic contact 170 is deposited on collector 140.

The foregoing device is manufactured by suitable sequential molecular beam epitaxial deposition processes or by other suitable process, including low pressure chemical vapor deposition. The collector 140, the base 120, the upper emitter layer or electrode 103 and the depleteable emitter layer 101 all comprise gallium arsenide with n+ doping. The depletable layer 101 is approximately 500 angstroms thick and has a doping of $4 \times 10^{17}$ cm$^{-3}$. The emitter, base, and collector electrodes 103, 120, 140 are also n+ doped with a concentration of $1 \times 10^{18}$ cm$^{-3}$. The emitter tunnel barrier 110 and collector tunnel barrier 130 comprise undoped aluminum gallium arsenide. Stop layer 102 of aluminum arsenide is of a nominal thickness, such as 20 angstroms; the emitter tunnel barrier is 100 angstroms thick and the collector tunnel barrier is 1,000 angstroms.

Base contact 160 is horizontally spaced from the emitter 100 and is deposited on depletable layer 101. The base metallic contact alloys into and otherwise diffuses through the emitter layer 101 to a depth sufficient to contact the base electrode 120. The thickness of layer 101 is such that the depth 190 of a depletion region 200 is of sufficient thickness that there is in effect, no current path in region 200 between the base contact 160 and emitter 100. The depth 190 of the depletion layer 200 depends upon the doping of the layer 101. For example, with a doping of $4 \times 10^{17}$ cm$^{-3}$ the layer 101 should be about 500 angstroms thick. As such, the depletion layer 200 (compared to depletion region 20 of FIG. 1) is effectively raised out of the base 120 and functions to electrically isolate the base contact 160 from the emitter 100.

As previously mentioned, the depletable layer 101 is a layer composed of normally conductive material. As such, one might expect that the base contact 160 and base 120 would be electrically connected via the layer 101 to the emitter contact 150. Such a connection would put a short circuit between the base contact 160 and the emitter 100.

However, in this instance, the depletion phenomena is used to the advantage of the invention and prevents such a circuit. Charge carriers or electrons are removed from region 200. Since there are no charge carriers in the region 200 between contact 160 and emitter 100, the base contact 160 is effectively electrically isolated from the emitter 100. As such, there is no short circuit as would normally be expected through the conductive depleted emitter layer 101.

Due to the depletion region 200 associated with the contact 160 the penetration of contact 160 can be kept shallow enough to prevent shorting the base 160 to the collector 140.

In fabricating the device 50, one can carefully control the depth of layer 101 by depositing an upper emitter layer and etching to form electrode 103 and layer 101. One may use an interferrometer to measure the depth of the residual emitter depletable layer 101 as it is being etched and terminate etching when the predetermined, suitable depth of the layer 101 is reached. As an aid in fabricating the device, one may apply a relatively thin, 20 angstrom stop layer 102 of aluminum arsenide above the emitter layer 101. So, etching can be terminated when the stop layer 102 is exposed. Such a stop layer will only slightly increase the series resistance of the layer 101 since the layer 102 is so thin. Aluminum arsenide has a low electron barrier, less than 0.3 electron volts.

The above ballistic transistor device has been described in connection with the use of gallium arsenide and aluminum gallium arsenide. However, those skilled in the art will recognize that other elements falling in class III and class V are also useful in forming such vertical ballistic devices. Those skilled in the art will also recognize the thickness of the various layers will depend in part upon the concentration of doping in the doped layer and the desired depth of depletion regions.

What is claimed is:

1. A vertical ballistic transistor comprising:
    a conductive carrier depletable emitter layer having a conductive emitter electrode layer extending therefrom;
    a conductive base electrode layer;
    a first tunnel barrier disposed between the emitter layer and the base electrode layer;
    a conductive collector electrode layer;
    a second barrier disposed between the collector electrode layer and the base electrode layer;
    an ohmic contact, deposited on the emitter layer spaced from the emitter electrode layer and extending through said emitter layer to electrically contact said base electrode layer; and
    a carrier depletion region in said emitter layer, said depletion region having boundaries sufficient to insulate the emitter electrode layer from the ohmic contact, and said emitter layer having boundaries sufficient to space the ohmic contact from said second barrier.

2. The vertical transistor of claim 1 wherein the emitter layer is formed from GaAs.

3. The vertical transistor of claim 1 wherein a portion of the emitter layer is exposed to thereby deplete the region under the exposed portion of charger carriers.

4. The vertical transistor of claim 3 wherein the emitter layer portion is exposed to air.

5. The vertical ballistic transistor of claim 1 wherein the conductive carrier depletable emitter layer is of sufficient thickness so that said ohmic contact is spaced from said second barrier.

6. The vertical ballistic transistor of claim 5 wherein the emitter layer is about 500 Angstroms.

* * * * *